(12) United States Patent
York

(10) Patent No.: US 8,397,146 B1
(45) Date of Patent: Mar. 12, 2013

(54) DEVICE FOR AND METHOD OF IDENTIFYING MINIMUM CANDIDATE CODEWORDS FOR LIST DECODER

(75) Inventor: Eric V. York, Severn, MD (US)

(73) Assignee: The United States of America as Represented by the Director of the National Security Agency, Washington, DC (US)

( * ) Notice: Subject to any disclaimer, the term of this patent is extended or adjusted under 35 U.S.C. 154(b) by 152 days.

(21) Appl. No.: 13/066,852

(22) Filed: Mar. 25, 2011

(51) Int. Cl.
*H03M 13/03* (2006.01)
*H03M 13/00* (2006.01)

(52) U.S. Cl. ........ 714/794; 714/746; 714/752; 714/780; 714/781

(58) Field of Classification Search .................. 714/780, 714/781, 794
See application file for complete search history.

(56) References Cited

U.S. PATENT DOCUMENTS

| | | | |
|---|---|---|---|
| 7,454,690 B1 | 11/2008 | Au et al. | |
| 7,519,898 B2 | 4/2009 | Narayanan et al. | |
| 2006/0190799 A1* | 8/2006 | Kan et al. | 714/758 |
| 2008/0126910 A1 | 5/2008 | Venkatesan et al. | |
| 2008/0301517 A1* | 12/2008 | Zhong | 714/752 |
| 2011/0214029 A1* | 9/2011 | Steiner et al. | 714/746 |
| 2011/0320916 A1* | 12/2011 | Natuzzi et al. | 714/780 |

* cited by examiner

*Primary Examiner* — Albert Decady
*Assistant Examiner* — Justin R Knapp
(74) *Attorney, Agent, or Firm* — Robert D. Morelli

(57) ABSTRACT

A device and method of determining candidates to decode by receiving a message, selecting m, identifying m voltages in message near zero volts, generating binary version of message, generating candidates that are variations of the binary message by varying the m positions, multiplying a modified binary message by the parity check matrix of the message, generating a matrix of the rows of the parity check matrix corresponding to the m positions, determining a rank v of the matrix, eliminating rows that are not linearly independent, determining if the sixth step result is in a span of the ninth step result, if so then there are $2^{m-1}-2^{m-v}(m-1)$ candidates, where the candidates can multiply the seventh step result to get the sixth step result and candidates with odd weights more than one Hamming distance from the candidates, otherwise there are $2^{m-1}$ candidates having odd weight.

2 Claims, 2 Drawing Sheets

DEVICE FOR AND METHOD OF IDENTIFYING MINIMUM CANDIDATE CODEWORDS FOR LIST DECODER

FIELD OF INVENTION

The present invention relates, in general, to error detection/correction and fault detection/recovery and, in particular, to digital data error correction.

BACKGROUND OF THE INVENTION

Noise in a communication channel often changes, or causes errors in, a number of bits in a message sent over the channel. To increase the probability that a recipient can determine the correct message from a received message that includes a limited number of errors redundancy is added to the transmitted message using an error-correcting code. Message so encoded must be decoded upon receipt to determine the intended message.

Decoding an encoded message has traditionally been done using algebraic techniques to convert a message represented by voltages to a binary representation of ones (i.e., 1) and zeros (i.e., 0) using a set threshold (i.e., a hard decision). For example, a threshold for the boundary between a +1 volts and −1 volts may be 0.0 volts. Any value below zero volts is determined to be a binary 0 and any value that is greater than zero volts is determined to be a binary 1. Such a threshold would convert the message (−0.2 volts, +1.1 volts, −0.3 volts, +0.9 volts, −0.8 volts, −0.9 volts, +0.3 volts, +0.1 volts) to (01010011). In recent years, it has become common to use soft decision decoding instead of hard decision decoding. In soft decision decoding, one threshold is not used to determine if a voltage in a message is a 1 or a 0. Instead, a user-definable number of voltages close to zero volts are identified as being either a 1 or a 0, where any voltage in the message that is above the highest value in the user-definable number of voltages is a 1, and where any voltage in the message that is below the lowest value in the user-definable number of voltages is a 0. The idea is that determining that the highest voltages are 1s is probably correct, determining that the lowest voltages are 0s is probably correct, and that each voltage within the user-definable range around zero volts could be either a 1 or a 0. So, the user-definable range probably contains the values that are most likely to cause errors in decoding a message and that these values probably deserve more attention in list decoding than the other values. In list decoding, the recipient of an encoded message (e.g., −0.2 volts, +1.1 volts, −0.3 volts, +0.9 volts, −0.8 volts, −0.9 volts, +0.3 volts, +0.1 volts) selects a number (e.g., 4) that represents the maximum number of anticipated errors in the encoded message. That number of positions in the encoded message closest to zero volts are then identified (e.g., −0.2 volts, −0.3 volts, +0.3 volts, and +0.1 volts). The encoded message is then converted to a binary format based on a user-definable threshold for when a 0 turns into a 1 (e.g., 0 volts). The positions in the binary form that correspond to the most likely positions containing errors are then identified (e.g., x1x100xx, where x denotes an error). Then, a number of copies equal to 2 raised to the number of error positions (e.g., $2^4=16$) of the binary encoded message are created, where the four positions represent the sixteen possible combinations of values for the error positions while the values of the error-free positions stay the same (e.g., 01010000, 01010001, 01010010, 01010011, 01110000, 01110001, 01110010, 01110011, 11010000, 11010001, 11010010, 11010011, 11110000, 11110001, 11110010, and 11110011). This technique produces near maximum likelihood results. That is, the list, which contains candidates for the binary representation of the encoded message, most likely contains the correct binary representation of the encoded message. Typically, each candidate message in the list is decoded (i.e., an exhaustive search) until the most likely decoded message is identified.

Since the list of encoded messages can be quite large, a device and method is needed that eliminates the need to do an exhaustive search for the intended message. The present invention is such a device and method.

U.S. Pat. No. 7,519,898, entitled "ITERATIVE DECODING OF LINEAR BLOCK CODES BY ADAPTING THE PARITY CHECK MATRIX," discloses a device for and method of decoding linear block code using an iterative message passing algorithm with a binary image of a parity check matrix of the linear block code, wherein the parity check matrix is adapted from one iteration to another based on reliabilities of bits in the linear block code by reducing a submatrix corresponding to the less reliable bits in the linear block code to a sparse nature before applying the message passing algorithm in each iteration. U.S. Pat. No. 7,519,898 is hereby incorporated by reference into the specification of the present invention.

U.S. Pat. No. 7,454,690, entitled "ARCHITECTURE AND CONTROL OF REED-SOLOMON LIST DECODING," discloses a device for and method of using both a "hard decoder" and a "soft decoder" for decoding based on the number of errors to correct. U.S. Pat. No. 7,454,690 is hereby incorporated by reference into the specification of the present invention.

U.S. Pat. Appl. No. 20080126910, entitled "LOW DIMENSIONAL SPECTRAL CONCENTRATION CODES AND DIRECT LIST DECODING," discloses a device for and method of providing an optionally keyed error-correcting code that is spectrally concentrated. U.S. Pat. Appl. No. 20080126910 is hereby incorporated by reference into the specification of the present invention.

SUMMARY OF THE INVENTION

It is an object of the present invention to identify the minimum number of encoded messages in a list to decode to arrive at an intended message.

The present invention is a device for and a method of determining the minimum number of candidate encoded messages in a list to decode.

The present invention performs the following steps.

The first step of the method is receiving an encoded message containing a number of voltages.

The second step of the method is selecting an integer m having a value that is less than the number of voltages in the encoded message.

The third step of the method is identifying m voltages and their positions within the encoded message that are closest to zero volts.

The fourth step of the method is generating a binary version of the encoded message.

The fifth step of the method is generating a list of candidate encoded messages that are variations of the binary version of the encoded message, where only the positions of the m voltages identified in the third step are varied between 0 and 1.

The sixth step of the method is multiplying the binary version of the encoded message by a parity check matrix associated with the encoded message.

The seventh step of the method is generating a matrix consisting of the rows of the parity check matrix that correspond to the positions identified in the third step.

The eighth step of the method is determining on the computing device a rank v of the matrix generated in the seventh step.

The ninth step of the method is eliminating rows of the matrix generated in the seventh step that are not linearly independent.

The tenth step of the method is determining if the result of the sixth step is in a span of the result of the ninth step.

The eleventh step of the method is if the result of the sixth step is in the span of the result of the ninth step then the number of candidate encoded messages to decode is $2^{m-1}-2^{m-v(m-1)}$, where the candidate encoded messages to be decoded are the results of the fifth step that can multiply the result of the seventh step to arrive at the result of the sixth step.

The twelfth step of the method is if the result of the sixth step is not in the span of the result of the ninth step then the number of candidate encoded messages to decode is $2^{m-1}$, where the candidate encoded messages to be decoded are the results of the fifth step with odd weight.

DETAILED DESCRIPTION

The present invention is a device for and a method of determining a minimum number of candidate encoded messages in a list to decode.

Figure 1:
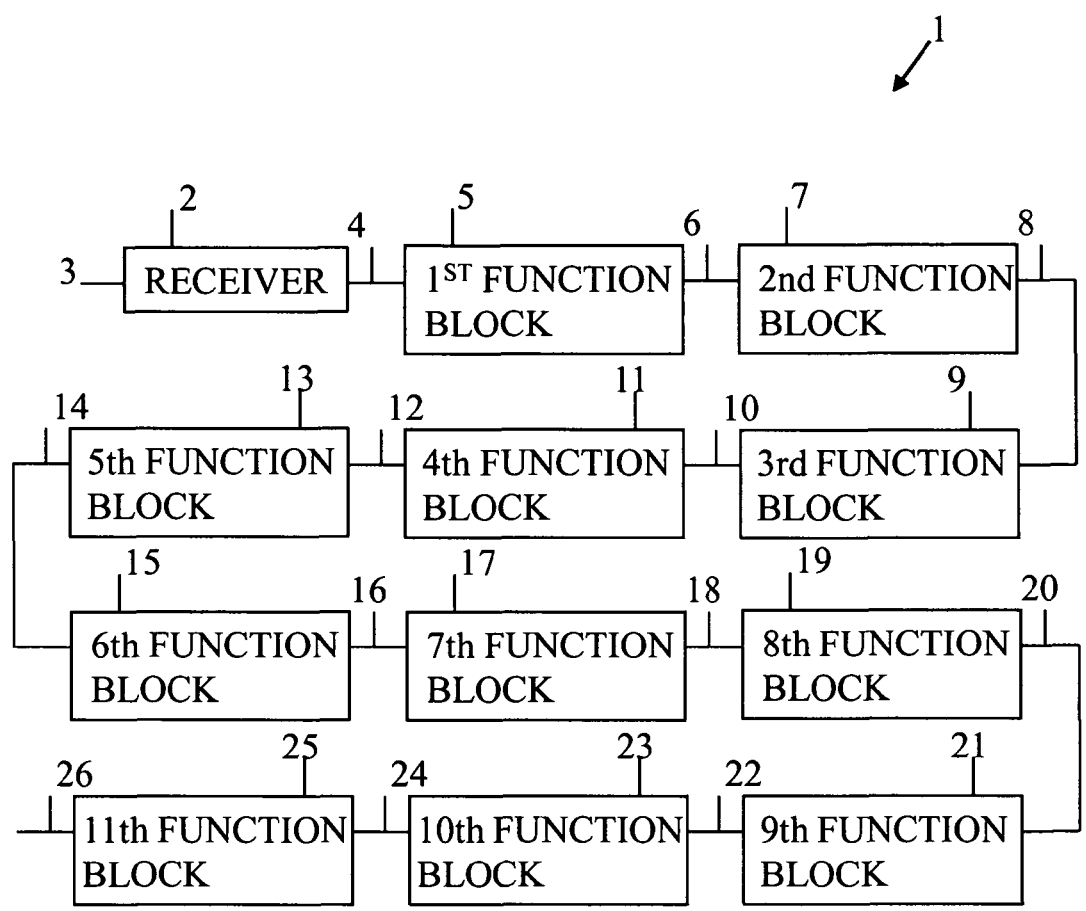
FIG. 1 is a schematic of the preferred device of the present invention.

FIG. 1 is a schematic of the preferred device 1 of the present invention.

The device 1 includes a receiver 2, having an input 3 for receiving an encoded message a number of voltages, and having an output 4. For example, the receiver 2 receives an encoded message such as (−0.2 volts, +1.1 volts, −0.3 volts, +0.9 volts, −0.8 volts, −0.9 volts, +0.3 volts, +0.1 volts).

The device 1 includes a first function block 5 for selecting a user-definable integer m, where m has a value that is less than the number of voltages in the received encoded message, having an input connected to the output 4 of the receiver 2, and having an output 6 at which appears the result of the first function block 5 and the output of the receiver 2. For example, selecting the integer 4 as the value for m.

The device 1 includes a second function block 7 for identifying m voltages and their positions within the encoded message that are closest to zero volts, having an input connected to the output 6 of the first function block 5, and having an output 8 at which appears the result of the second function block 7 and the output 6 of the first function block 5. In the present example, the 4 positions in the encoded message closest to zero volts are (−0.2 volts, −0.3 volts, +0.3 volts, and +0.1 volts) at positions 1, 3, 7, and 8 in the encoded message.

The device 1 includes a third function block 9 for generating a binary version of the encoded message, having an input connected to the output 8 of the second function block 7, and having an output 10 at which appears the result of the third function block 9 and the output of any function block connected directly or indirectly to the input of the third function block 9. In the present example, the binary form of the encoded message, where any voltage above 0 volts is considered a binary 1 and any voltage below 0 volts is considered a binary 0, is 01010011.

The device 1 includes a fourth function block 11 for generating a list of candidate encoded messages that are variations of the binary version of the encoded message, where only the positions of the m voltages identified by the second function block 7 are varied between 0 and 1, having an input connected to the output 10 of the third function block 9, and having an output 12 at which appears the result of the fourth function block 11 and the output of any function block connected directly or indirectly to the input of the fourth function block 11. In the present example, the 4 positions (i.e., possible error positions) in the binary version of the encoded message that are varied are denoted with an "x" as x1x100xx. Then, a number of copies equal to 2 raised to the number of possible error positions (e.g., $2^4=16$) of the binary version of the encoded message are created, where the four positions are varied to create sixteen combinations of values for the possible error positions while the values of the other positions stay the same (e.g., 01010000, 01010001, 01010010, 01010011, 01110000, 01110001, 01110010, 01110011, 11010000, 11010001, 11010010, 11010011, 11110000, 11110010, 11110010, and 11110011).

The device 1 includes a fifth function block 13 for multiplying a modified version of the binary version of the encoded message by a parity check matrix associated with the encoded message, where the modified version of the binary version of the encoded message is the binary version of the encoded message with the positions identified by the second function block set to zero, having an input connected to the output 12 of the fourth function block 11, and having an output 14 at which appears the result of the fifth function block 13 and the output of any device connected directly or indirectly to the input of the fifth function block 13. In the present example, the parity check matrix is as follows:

1101
0111
1110
1011
1000
0100
0010
0001.

Multiplying the binary version of the encoded message with zero placed in the m voltages identified by the second function block 7 (i.e., 01010000) by the parity check matrix results in (1100), which is commonly referred to as a syndrome.

The device 1 includes a sixth function block 15 for generating a matrix consisting of the rows of the parity check matrix that correspond to the positions of the voltages identified by the second function block 7, having an input connected to the output 14 of the fifth function block 13, and having an output 16 at which appears the result of the sixth function block 15 and the output of any device connected directly or indirectly to the input of the sixth computing device 15. In the present example, the $1^{st}$, $3^{rd}$, $7^{th}$, and $8^{th}$ voltage positions were identified by the second function block 7. Therefore, a matrix consisting of the 1st, 3rd, 7th, and 8th rows of the parity check matrix is as follows:

1101
1110
0010
0001.

The device 1 includes a seventh function block 17 for determining a rank v of the matrix generated by the sixth function block 15, having an input connected to the output 16 of the sixth function block 15, and having an output 18 at which appears the result of the seventh function block 17 and the output of any device connected directly or indirectly to the input of the seventh function block 17. In the present example, the rank of a matrix is the number of rows that cannot be reduced to an all zeros row in the original matrix, without considering the identity matrix, by adding other rows to it. That is, append an identity matrix to the matrix for bookkeeping purposes (i.e., to identify which rows were added to get a particular result) as follows:

11011000
11100100
00100010
00010001.

Add row 1 to row 2 to get the following result:

11011000
00111100
00100010
00010001.

Add row 3 to row 2 to get the following result:

11011000
00011110
00100010
00010001.

Add row 4 to row 2 to get the following result:

11011000
00001111
00100010
00010001.

Since no other rows of the original matrix can be reduced to all zeros, and there are 3 rows in the original matrix that are non-zero then the rank of the matrix is 3.

The device 1 includes an eighth function block 19 for eliminating rows of the matrix generated in the sixth function block 15 that are not linearly independent, having an input connected to the output 18 of the seventh function block 17, and having an output 20 at which appears the result of the eighth function block 19 and the output of any device connected directly or indirectly to the input of the eighth function block 19. In the present example, the matrix is reduced by eliminating the all zero row in the original matrix as follows:

11011000
00100010
00010001.

The device 1 includes a ninth function block 21 for determining if the result of the fifth function block 13 is in a span of the result of the eighth function block 19, having an input connected to the output 20 of the eighth function block 19, and having an output 22 at which appears the result of the ninth function block 21 and the output of any device connected directly or indirectly to the input of the ninth function block 21. A span of a set of first vectors is a set of all possible combinations (i.e., additions) of the first vectors. A second vector is in the span of the set of first vectors if a combination of first vectors results in the second vector. In the present example, 1100 is in the span of the reduced matrix (1101, 0010, 0001), absent the identity matrix, because 1101+0001=1100. Alternatively in the present example, (1100) is in the span of the reduced matrix that resulted from the eight function block 19 if (11000000), where (0000) was appended to (1100) for bookkeeping purposes, can be added to rows of the reduced matrix to result in all zeros. Adding (11000000) to the first row of the reduced matrix results in the following matrix:

00011000
00100010
00010001.

Adding the first row to the third row reduces the first row to all zeros in the non-bookkeeping section as follows:

00001001.

Therefore, (1100) is in the span of the reduced matrix, and the bookkeeping section indicates that the candidate encoded messages in the list of candidate encoded messages generated by the fourth function block 11 are 1001 and its compliment 0110. In base 10, 1001 is 9 and 0110 is 6. So, the $9^{th}$ and $6^{th}$ (counting from zero) candidate encoded messages in the list generated by the fourth function block 11 are the only two candidate encoded messages that need be decoded to decode the encoded message in this example.

The device 1 includes a tenth function block 23 for determining the number of candidate encoded messages to decode as $2^{m-1}-2^{m-v}(m-1)$ if the result of the fifth function block 13 is in the span of the result of the eighth function block 19, where the candidate encoded messages to be decoded are the results of the fourth function block 11 that can multiply the result of the sixth function block 15 to arrive at the result of the fifth function block 13 and any results of the fourth function block 11 with odd weights that are more than one Hamming distance away from the candidate encoded messages, having an input connected to the output 22 of the ninth function block 21, and having an output 24 at which appears the result of the tenth function block 23 and the output of any device connected directly or indirectly to the input of the tenth function block 23. In the present example, (1111) is in the span of the reduced matrix. So, the number of candidate encoded messages that need be decoded are $2^{(4-1)}-2^{(4-3)}(4-1)=8-(2\times 3)=2$. That is, the $6^{th}$ and $9^{th}$ candidate encoded messages identified above, which are 01110010 and 11010001, respectively, and which differ from the encoded message identified above using a hard decision (i.e., 01010011).

The device 1 includes an eleventh function block 25 for determining the number of candidate encoded messages to decode as $2^{m-1}$ if the result of the fifth function block 13 is not in the span of the result of the eighth function block 19, where the candidate encoded messages to be decoded are the results of the fourth function block 11 with odd weight, having an input connected to the output 24 of the tenth function block 23, and having an output 26 at which appears the result of the eleventh function block 25 and the output of any device connected directly or indirectly to the input of the eleventh function block 25.

Figure 2:
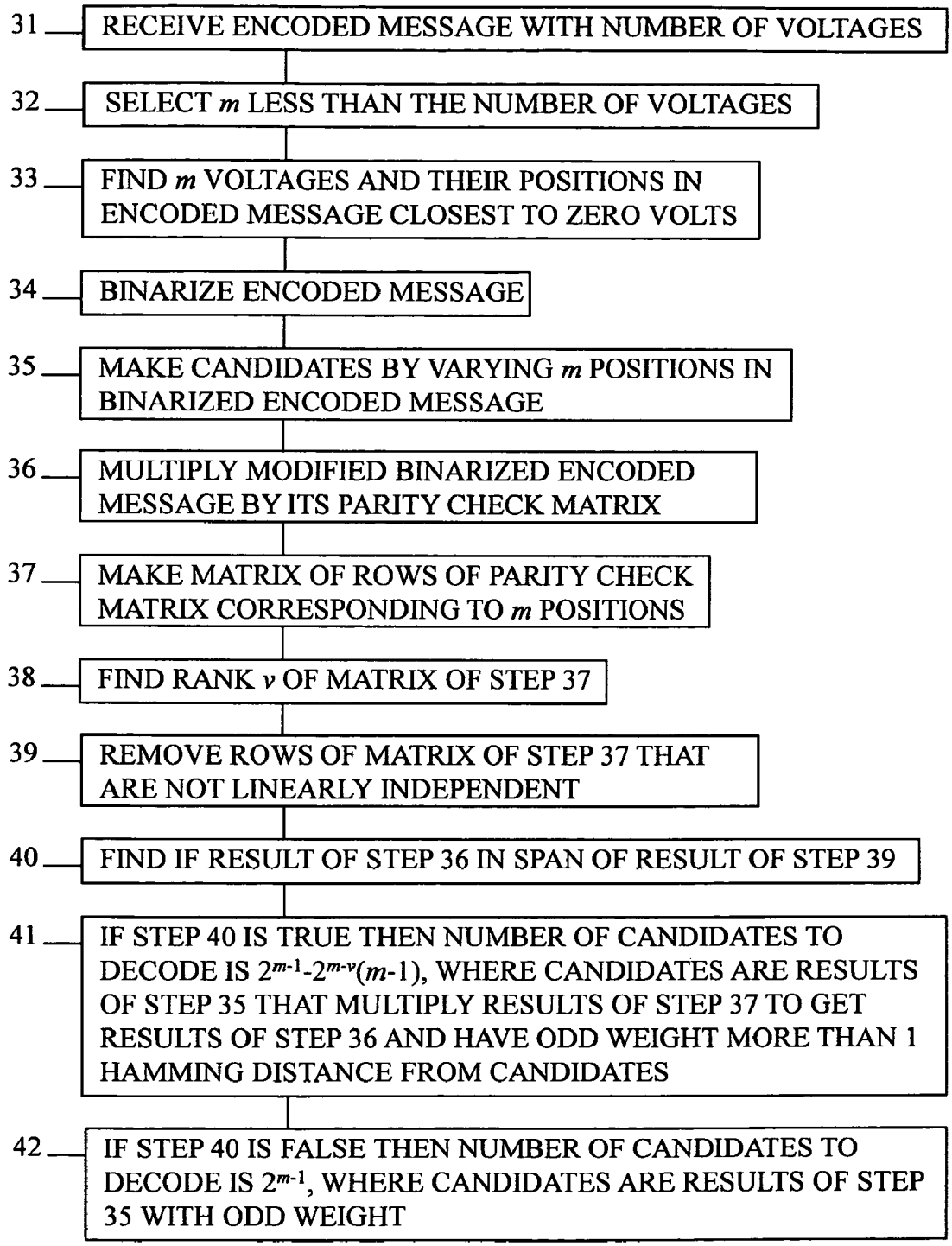
FIG. 2 is a flowchart of the preferred method of the present invention.

FIG. 2 is a flow-chart of the method of the present invention.

The method includes a first step 31 of receiving on a computing device an encoded message, where the encoded messages includes a number of voltages.

The method includes a second step 32 of selecting on the computing device a user-definable integer m, where m has a value that is less than the number of voltages in the encoded message The method includes a third step 33 of identifying on the computing device m voltages and their positions within the encoded message that are closest to zero volts.

The method includes a fourth step 34 of generating on the computing device a binary version of the encoded message.

The method includes a fifth step 35 of generating on the computing device a list of candidate encoded messages that are variations of the binary version of the encoded message, where only the positions corresponding to the m voltages identified in the third step 33 are varied between 0 and 1.

The method includes a sixth step 36 of multiplying on the computing device a modified version of the binary version of the encoded message by a parity check matrix associated with the encoded message, where the modified version of the binary version of the encoded message is the binary version of the encoded message with the positions identified in the third step 33 set to zero.

The method includes a seventh step 37 of generating on the computing device a matrix consisting of the rows of the parity check matrix that correspond to the m positions identified in the third step 33.

The method includes an eighth step 38 of determining on the computing device a rank v of the matrix generated in the seventh step 37.

The method includes a ninth step 39 of eliminating on the computing device rows of the matrix generated in the seventh step 37 that are not linearly independent.

The method includes a tenth step 40 of determining on the computing device if the result of the sixth step 36 is in the span of the result of the ninth step 39.

The method includes an eleventh step 41 of if the result of the sixth step 36 is in the span of the result of the ninth step 39 then the number of candidate encoded messages to decode is $2^{m-1}-2^{m-v}(m-1)$, where the candidate encoded messages to be decoded are the results of the fifth step 35 that can multiply the result of the seventh step 37 to arrive at the result of the sixth step 36 plus all odd weight vectors in the list determined in the fifth step 35 that are more than a Hamming distance of one away from this set of vectors.

The method includes a twelfth step 42 of if the result of the sixth step 36 is not in the span of the result of the ninth step 39 then the number of candidate encoded messages to decode is $2^{m-1}$, where the candidate encoded messages to be decoded are the results of the fifth step 35 with odd weight.

What is claimed is:

1. A device for determining a minimum number of candidate encoded messages in a list to decode, comprising:
   a) a receiver, having an input for receiving an encoded message as a number of voltages, and having an output;
   b) a first function block for selecting a user-definable integer m, where m is less than the number of voltages in the encoded message, having an input connected to the output of the receiver, and having an output at which appears the result of the first function block and the output of the receiver;
   c) a second function block for identifying m voltages and their positions within the encoded message that are closest to zero volts, having an input connected to the output of the first function block, and having an output at which appears the result of the second function block and the output of the first function block;
   d) a third function block for generating a binary version of the encoded message, having an input connected to the output of the second function block, and having an output at which appears the result of the third function block and the output of the second function block;
   e) a fourth function block for generating a list of all possible candidate encoded messages that are variations of the binary version of the encoded message, where only the positions of the m voltages identified by the second function block are each assigned the binary values 0 and 1 to generate $2^m$ candidate encoded messages, having an input connected to the output of the third function block, and having an output at which appears the result of the fourth function block and the output of the third function block;
   f) a fifth function block for multiplying a modified version of the binary version of the encoded message by a parity check matrix associated with the encoded message, where the modified version of the binary version of the encoded message is the binary version of the encoded message with the positions identified in the second function block set to zero, where the parity check matrix includes rows, having an input connected to the output of the fourth function block, and having an output at which appears the result of the fifth function block and the output of the fourth function block;
   g) a sixth function block for generating a matrix consisting of the rows of the parity check matrix that correspond to the positions of the m voltages identified by the second function block, having an input connected to the output of the fifth function block, and having an output at which appears the result of the sixth function block and the output of the fifth function block;
   h) a seventh function block for determining a rank v of the matrix generated by the sixth function block, where v is a number, having an input connected to the output of the sixth function block, and having an output at which appears the result of the seventh function block and the output of the sixth function block;
   i) an eighth function block for eliminating rows of the matrix generated in the sixth function block that are not linearly independent, having an input connected to the output of the seventh function block, and having an output at which appears the result of the eighth function block and the output of the seventh function block;
   j) a ninth function block for determining if the result of the fifth function block is in a span of the result of the eighth function block, having an input connected to the output of the eighth function block, and having an output at which appears the result of the ninth function block and the output of the eighth function block;
   k) a tenth function block for determining the number of candidate encoded messages to decode as $2^{m-1}-2^{m-v}(m-1)$ if the result of the fifth function block is in the span of the result of the eighth function block, where the candidate encoded messages to be decoded are the results of the fourth function block that multiply the result of the sixth function block to arrive at the result of the fifth function block and any results of the fourth function block with odd weights that are more than one Hamming distance away from the candidate encoded messages, having an input connected to the output of the ninth function block, and having an output at which appears the result of the tenth function block and the output of the ninth function block; and
   l) an eleventh function block for determining the number of candidate encoded messages to decode as $2^{m-1}$ if the result of the fifth function block is not in the span of the result of the eighth function block, where the candidate encoded messages to be decoded are the results of the fourth function block with odd weight, having an input connected to the output of the tenth function block, and having an output at which appears the result of the eleventh function block and the output of the tenth function block.

2. A method of determining a minimum number of candidate encoded messages in a list to decode, comprising the steps of:
   a) receiving on a computing device an encoded message, where the encoded message includes a number of voltages;
   b) selecting on the computing device a user-definable integer m, where m is less than the number of voltages in the encoded message;

c) identifying on the computing device m voltages and their positions within the encoded message that are closest to zero volts;
d) generating on the computing device a binary version of the encoded message;
e) generating on the computing device a list of all possible candidate encoded messages that are variations of the binary version of the encoded message, where positions corresponding to the positions of the m voltages identified in step (c) are each assigned binary values 0 and 1 to generate $2^m$ candidate encoded messages;
f) multiplying on the computing device a modified version of the binary version of the encoded message by a parity check matrix associated with the encoded message, where the modified version of the binary version of the encoded message is the binary version of the encoded message with the positions identified in step (c) set to zero, where the parity check matrix includes rows;
g) generating on the computing device a matrix consisting of the rows of the parity check matrix that correspond to the m positions identified in step (c);
h) determining on the computing device a rank v of the matrix generated in step (g), where v is a number;
i) eliminating on the computing device rows of the matrix generated in step (g) that are not linearly independent;
j) determining on the computing device if the result of step (f) is in a span of the result of step (i);
k) if the result of step (f) is in the span the result of step (i) then the number of candidate encoded messages to decode is $2^{m-1} - 2^{m-v}(m-1)$, where the candidate encoded messages to be decoded are the results of step (e) that multiply the result of step (g) to arrive at the result of step (f) and any results of step (e) with odd weights that are more than one Hamming distance away from the candidate encoded messages; and
l) if the result of step (f) is not in the span of the result of step (i) then the number of candidate encoded messages to decode is $2^{m-1}$, where the candidate encoded messages to be decoded are the results of step (e) with odd weight.

* * * * *